Sept. 20, 1966 M. LAITY 3,274,451

ELECTRONIC EQUIPMENT CABINET

Filed Feb. 13, 1964

INVENTOR.
MAX LAITY

BY John M. Nolan
ATTORNEY

United States Patent Office 3,274,451
Patented Sept. 20, 1966

3,274,451
ELECTRONIC EQUIPMENT CABINET
Max Laity, 2032 37th St., Rock Island, Ill.
Filed Feb. 13, 1964, Ser. No. 344,700
8 Claims. (317—122)

This invention relates to an electronic equipment cabinet and more particularly to an electronic equipment cabinet utilizing a metal frame which partially comprises the exterior of the cabinet and also forms a conduit for wiring to and from various pieces of equipment in said cabinet.

With the increasing use of different types of electronic equipment in varying combinations in custom installations for industrial, commercial or residential use, a need has arisen for cabinets to accommodate the varies pieces of equipment. Thus, cabinets have been designed which will house various components necessary for any desired system such as a public address system.

Previous cabinets have generally used a frame, the exterior of the cabinet being fastened to the frame. Wires from the power supply to the various components or wires from one component to another were strung haphazardly within the cabinet, increasing the possibility of shorts or of confusing one wire with another in installing or maintaining the system.

The present invention discloses a cabinet wherein the cabinet frame also forms part of the cabinet exterior, said construction resulting in a simpler, lighter, more economical and more attractive cabinet. The frame also forms a conduit for running the wires within the cabinet, making the cabinet neater, safer and easier to maintain.

Accordingly, one of the objects of the present invention is to provide an electronic equipment cabinet to accommodate various electronic components.

A further object of the present invention is to provide an electronic equipment cabinet wherein the cabinet frame also forms part of the cabinet exterior.

Another object of the present invention is to provide an electronic equipment cabinet wherein the cabinet frame forms a conduit for wires within the cabinet.

Another object of the present invention is to provide an electronic equipment cabinet wherein the cabinet frame is made of extruded metal, making the cabinet of sturdy and simple construction.

Still another object of the present invention is to provide an electronic equipment cabinet wherein the frame is made of extruded aluminum, said frame also comprising part of the cabinet exterior, making said cabinet attractive in appearance, of inexpensive, simple, and light weight construction, that is nevertheless sturdy.

Still another object of the present invention is to provide an electronic equipment cabinet wherein the equipment is attached to a frame, the cabinet cover also being attached to the frame so that it may easily be removed or swung away, exposing the equipment for ease in maintenance.

The foregoing and other objects and advantages of the invention will appear more fully hereinafter from consideration of the drawings and detailed description which follow. It is to be expressly understood, however, that the drawings are for the purpose of illustration only and are not to be construed as defining the limits of the invention.

In the drawings.

In the drawings, similar characters of reference indicate corresponding parts in the several views.

Figure 1:
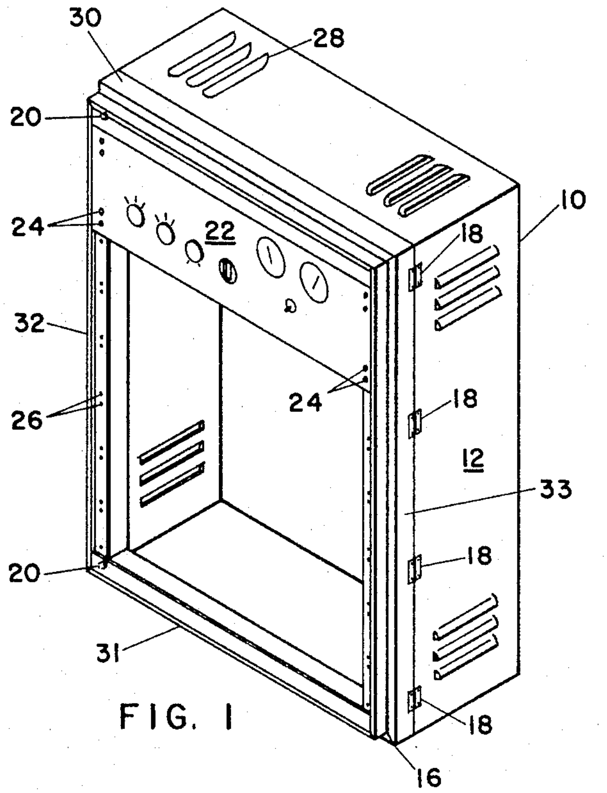
FIGURE 1 is a perspective view of the electronic equipment cabinet showing one panel of installed equipment.

Referring now to the drawings and in particular to FIGURE 1, there is shown equipment cabinet 10 comprising cabinet cover 12 and frame 16. Cabinet cover 12 is fastened to frame 16 by means of hinge 18 and bolts 20.

Equipment panel 22 is fastened to frame 16 by means of screws 24 inserted through panel 22 into screw taps 26 in frame 16. Screw taps 26 are located at definite intervals along frame 16 to match holes in panel 22. All standard equipment panels have screw holes in the same locations and screw taps 26 in frame 16 are adaptable to receive screws through said standard screw holes. Cabinet cover 12 has a plurality of ventilators 28. Frame 16 is rectangular in shape and is composed of upper frame member 30 and lower frame member 31 which are similar and side frame member 32 and side frame member 33 which are also similar.

Figure 2:
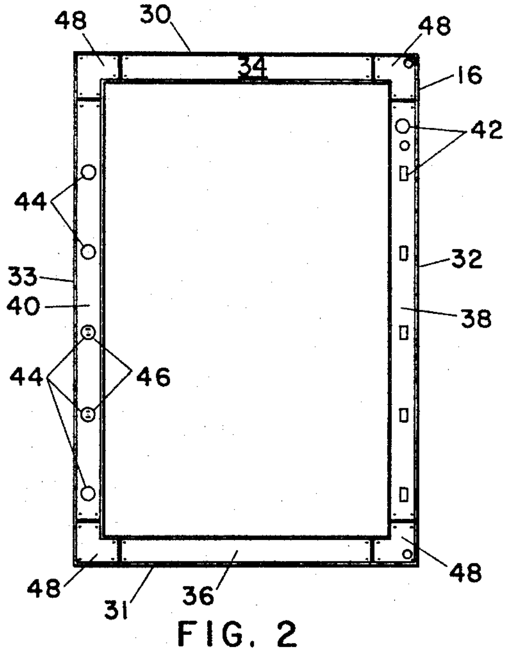
FIGURE 2 is a rear view of the cabinet frame including the frame cover plates.

FIGURE 2 is a rear view of frame 16 showing upper frame cover plate 34 fastened to upper frame member 30 and lower frame cover plate 36 fastened to lower frame member 31. Side cover plate 38 is fastened to side frame member 32. Said side cover plate 38 and side frame member 32 form a conduit running the length of frame 16. Side cover plate 38 forms a plurality of apertures 42 through which wires may be inserted into and withdrawn from said conduit.

Side cover plate 40 is fastened to side frame member 33, also forming a conduit running the length of frame 16. Side cover plate 40 forms apertures 44 which permits the running of wires to and from said conduit. Said conduit may also be used to distribute a power supply to various levels of cabinet 10, wires from an external power supply being introduced at one of said apertures 44, said wires terminating at power supply sockets 46 which protrude through apertures 44. Corner cover plates 48 cover the frame members at each of the four corners.

Figure 3:
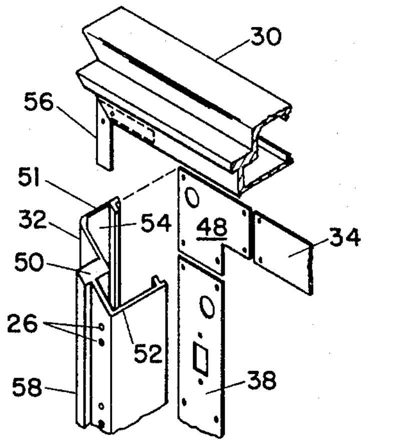
FIGURE 3 is an exploded view of one corner of the frame showing the construction and assembly of the frame and frame cover plates.

The construction and assembly of frame 16 is shown in FIGURE 3. Upper frame member 30 and side frame member 32 are made of extruded metal, preferably aluminum. Said frame members are somewhat channel shaped in cross section, having a front section 50 between side sections 51 and 52. The open end of side sections 51 and 52 is adapted to receive cover plates 34, 36, 38, 40 and 48. When the open end of said channel shaped frame members are closed by said cover plates, conduit cavity 54 is formed.

The four frame members have mitered ends and are fastened together by means of corner brackets 56 at each corner, the adjoining frame members each being fastened to bracket 56. Screw taps 26 are located on the exterior surface of front section 50 of side members 32 and 33. Boss 58 protrudes from the exterior surface of said front section 50 around the perimeter of frame 16, the distance between the interior sides of said bosses on the side members being slightly greater than the width of a standard equipment panel 22, as shown in FGURE 1.

In use the equipment cabinet is assembled as shown in FIGURE 3. Equipment panels are installed within the cabinet as shown in FIGURE 1. If the entire panel area is not utilized, blank panels can be inserted in the open areas, giving a more attractive appearance to the cabinet and also providing greater protection for the equipment. Power to operate the various panels is supplied by power supply sockets 46. Wires from one equipment panel to the other are run through the conduit formed by side frame member 32 and side cover plate 38, the wires running in and out apertures 42. To service the equipment either the individual panel is removed or the frame 16 and the equipment panels mounted thereon are swung away from the cover 12 on hinges 18 after bolts 20 are removed.

While the equipment cabinet as shown in the drawings is of the construction shown and described, it is understood that the invention is not limited to any particular form of construction. Moreover, other changes and modifications of the novel equipment cabinet may be made by those skilled in the art without departing from the scope of the instant invention.

I claim:

1. A cabinet comprising a vertical frame substantially rectangular in shape formed by a plurality of members joined at their ends, said frame members having a channel shaped cross section, the open side of each member facing the same direction and being covered with one or more plates, forming a rectangular conduit, said frame also forming part of the cabinet exterior, and a cabinet cover open on one side, the outer perimeter of said open side conforming to and being attached to the outer perimeter of said frame.

2. An electronic equipment cabinet comprising a frame substantially rectangular in shape formed by a plurality of members joined at their ends, said frame members having a channel shaped cross section, the open side of each member facing the same direction and being covered with one or more plates, forming a conduit, the closed side of each channel shaped member partially forming the front of said cabinet, a boss protruding from said closed side extending around said frame, the inside surface of said boss and said closed side forming a recess adaptable to receive one or more panels of electronic equipment, means for fastening said electronic equipment panels to said frame and a box like cabinet body open on one side the outer perimeter of said open side conforming to the outer perimeter of said frame and being attached at the open side of said frame members.

3. An electronic equipment cabinet comprising: an upright frame, substantially rectangular in shape and including opposite upright side members and top and bottom members joined at their ends, said frame members having a generally channel shaped cross-section open rearwardly; at least one cover plate mounted over the open side of at least one frame member forming a conduit, each cover plate having at least one aperture providing access to said conduit; and a cabinet body having a forwardly disposed, generally rectangular opening, the perimeter of said opening conforming to and being attached to the cabinet frame.

4. The invention defined in claim number 3 wherein the closed side of each frame member faces forwardly, partially forming the cabinet front.

5. The invention defined in claim number 4 wherein each frame member is covered by a cover plate, forming a rectangular conduit around the forward end of said cabinet.

6. The invention defined in claim number 5 wherein the cover plates over said side frame member include a plurality of apertures between said conduit and the cabinet interior.

7. The invention defined in claim number 6 and including a plurality of power supply sockets in said cover plates, and also including wire means operably connected to each socket and extending to the cabinet exterior for conducting electrical power to said sockets.

8. The invention defined in claim number 4 and including a boss extending forwardly from the closed side of each frame member, extending around said frame, and forming a rectangular recess adaptable to receive at least one panel of electronic equipment and including means for fastening said panels to the frame within said recess.

References Cited by the Examiner

UNITED STATES PATENTS

| | | | |
|---|---|---|---|
| 1,732,346 | 10/1929 | Waller | 317—99 |
| 1,962,554 | 6/1934 | DeMask | 317—122 |
| 2,594,010 | 4/1952 | Graham et al. | 317—122 |
| 3,012,835 | 12/1961 | Anderson et al. | 312—257 |
| 3,178,246 | 4/1965 | Riles | 312—257 |

ROBERT K. SCHAEFER, *Primary Examiner.*

KATHLEEN H. CLAFFY, *Examiner.*

M. GINSBURG, *Assistant Examiner.*